(12) United States Patent  
Cavallieri et al.

(10) Patent No.: US 9,192,075 B1  
(45) Date of Patent: Nov. 17, 2015

(54) WIRE DRESS COVER

(71) Applicant: TYCO ELECTRONICS BRASIL LTDA., Sao Paulo (BR)

(72) Inventors: Amadeu Luiz Fazani Cavallieri, Campinas (BR); Jose Roberto Goldschmidt, Campinas (BR)

(73) Assignee: TYCO ELECTRONICS BRASIL LTDA, Sao Paulo (BR)

( * ) Notice: Subject to any disclaimer, the term of this patent is extended or adjusted under 35 U.S.C. 154(b) by 0 days.

(21) Appl. No.: 14/445,293

(22) Filed: Jul. 29, 2014

(51) Int. Cl.  
*H01R 13/58* (2006.01)  
*H05K 7/20* (2006.01)  
*H01R 13/52* (2006.01)

(52) U.S. Cl.  
CPC .......... *H05K 7/2039* (2013.01); *H01R 13/5213* (2013.01); *H01R 13/58* (2013.01)

(58) Field of Classification Search  
CPC ... H01R 13/58; H01R 13/5833; H01R 9/2416  
USPC ......... 439/485, 190–206, 449, 452, 456, 457, 439/519, 521, 892, 942  
See application file for complete search history.

(56) References Cited

U.S. PATENT DOCUMENTS

| 4,880,594 | A * | 11/1989 | Fu .................................. 361/692 |
| 4,898,009 | A * | 2/1990 | Lakoski et al. .................... 70/58 |
| 5,076,802 | A | 12/1991 | Colleran et al. |
| 6,155,884 | A * | 12/2000 | Sugiyama ...................... 439/701 |
| 6,247,944 | B1 * | 6/2001 | Bolognia et al. ............... 439/157 |
| 6,350,147 | B2 * | 2/2002 | Brownell et al. .............. 439/468 |
| 7,201,592 | B2 * | 4/2007 | Hata ............................. 439/206 |
| 8,303,331 | B2 * | 11/2012 | Yu et al. ......................... 439/485 |
| 8,339,784 | B2 * | 12/2012 | Pirillis ........................... 361/692 |

* cited by examiner

*Primary Examiner* — Neil Abrams  
*Assistant Examiner* — Travis Chambers

(57) ABSTRACT

A wire dress cover for an electrical connector. The wire dress cover includes a rear wall with heat dissipating openings which extend therethrough. Side walls and end walls extend from the rear wall. At least one wire receiving opening is provided in the side walls or the end walls. Guards are positioned proximate the heat dissipating openings. The guards have guard side walls with side wall openings which extend therethrough. Top walls of the guards extend from the guard side walls. The top walls extend over at least a portion of the heat dissipating openings. The heat dissipating openings and the side wall openings allow for heat generated inside the wire dress cover to be dissipated to the outside of the wire dress cover, while the top walls of the guards deter material from entering the inside of the wire dress cover.

20 Claims, 3 Drawing Sheets

WIRE DRESS COVER

FIELD OF THE INVENTION

The present invention is directed to a wire dress cover which protects the wires and terminals from damage due to water splash while providing for effective heat exchange.

BACKGROUND OF THE INVENTION

Many electrical connectors are employed in environments where forces may be exerted on the wires which extend from the electrical connectors. These forces can damage the electrical terminations of the wires to the terminals in the housings of the connectors. Electrical connectors with a large number of wires are particularly susceptible to having damaged electrical terminations within the connector housing. For example, wires from one connector may tangle with wires from other connectors such that the movement of any one connector may damage the termination of wires in other connectors. The tangling of wires can also make the tracing of wires during troubleshooting operations difficult to achieve.

Prior art electrical connectors have employed covers, boots or the like on the connector housing to orient or dress the wires. Some prior art wire dress covers define a unitary member having an aperture through which the plurality of wires pass. Covers of this type generally are effective, but complicate the termination and assembly process. More particularly, the cover may have to be mounted over the wires prior to termination and prior to inserting the terminated wires into the housing. Repairs or replacement of damaged or defective leads after termination and insertion is similarly complicated by the need to extract one lead from the aperture in the cover and insert another lead therethrough. This is particularly difficult if the cover tightly engages the wires to contribute to either sealing or strain relief.

The prior art further includes wire covers that can be mounted to the connector after termination and after proper seating of the terminals in the connector. These prior art connectors have included a unitary cover effectively defining a channel mounted to the rear end of the electrical connector housing. Other prior art connectors have included multi-component housings including a plurality of components for engaging the wires passing into the electrical connector housing.

Other prior art connectors include wire dress covers which are easily inserted and removed from the housing of the connector. One such wire dress cover is shown in U.S. Pat. No. 5,076,802. The connector includes a channel on the rear face into which the wire dress cover is slidably engagable. The wire dress cover includes a rib for slidable engagement in the channel and a locking projection for lockingly engaging the housing after a full seating thereon. The wire dress cover includes a slot extending centrally therein to enable the cover to be pinched for disengaging the locking projections from the housing. In certain embodiments the wire dress cover is defined by a pair of wire dress cover shells which are lockingly engagable with one another.

While the wire dress covers of the prior art are effective for organizing wires and for preventing damage to the electrical terminations, in order to provide maximum protection from the environment, the wire dress covers are often molded as a one-piece, solid member which prevents any type of unwanted material, such as water or solid particles, from entering the wire dress cover and adversely effecting the electrical terminations. However, as electronic devices and connectors become more sophisticated, more current and more electrical terminations are required, thereby generating more heat in the wires and at the electrical terminations. Most of these prior art wire dress covers have not been constructed to provide sufficient heat exchange or heat dissipation.

It would, therefore, be beneficial to provide a wire dress cover which would allow for heat to be dissipated from the wires and the electrical terminations. It would also be beneficial to provide such a heat dissipating wire dress cover which provides protection against unwanted material, such as water, from effecting the electrical terminations.

SUMMARY OF THE INVENTION

In view of the above, it is an object of the subject invention to provide a wire dress cover which allows for heat dissipation while providing protection to the wires and the electrical terminations.

An embodiment is directed to a wire dress cover for an electrical connector. The wire dress cover includes a rear wall with heat dissipating openings which extend therethrough. Side walls and end walls extend from the rear wall. At least one wire receiving opening is provided in the side walls or the end walls. Guards are positioned proximate the heat dissipating openings. The guards have guard side walls with side wall openings which extend therethrough. Top walls of the guards extend from the guard side walls. The top walls extend over at least a portion of the heat dissipating openings. The heat dissipating openings and the side wall openings allow for heat generated inside the wire dress cover to be dissipated to the outside of the wire dress cover, while the top walls of the guards deter material from entering the inside of the wire dress cover.

An embodiment is directed to a wire dress cover for an electrical connector. The wire dress cover includes a rear wall with heat dissipating openings which extend therethrough. Side walls and end walls extend from the rear wall. At least one wire receiving opening is provided in the side walls or the end walls, the at least one wire receiving opening provides a region for wires to extend from the wire dress cover and the electrical connector. Splash guards are positioned proximate the heat dissipating openings. The splash guards have guard side walls with side wall openings which extend therethrough. Top walls of the splash guards extend from the guard side walls. The top walls extend over at least a portion of the heat dissipating openings. The top walls have curved top surfaces. The heat dissipating openings and the side wall openings allow for heat generated inside the wire dress cover to be dissipated to the outside of the wire dress cover, while the top walls of the splash guards facilitate deflection of material away from the side wall openings, thereby deterring the material from entering the inside of the wire dress cover.

An embodiment is directed to a wire dress cover for an electrical connector. The wire dress cover includes a rear wall which has heat dissipating openings which extend therethrough. Splash guards are positioned proximate the heat dissipating openings. The splash guards have guard side walls with side wall openings which extend therethrough. Top walls of the splash guards extend from the guard side walls. The top walls extend over at least a portion of the heat dissipating openings. The top walls have concave curved top surfaces. The heat dissipating openings and the side wall openings allow for heat generated inside the wire dress cover to be dissipated to the outside of the wire dress cover, while the top walls of the splash guards facilitate deflection of water droplets away from the side wall openings, thereby deterring the water droplets from entering the inside of the wire dress cover.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
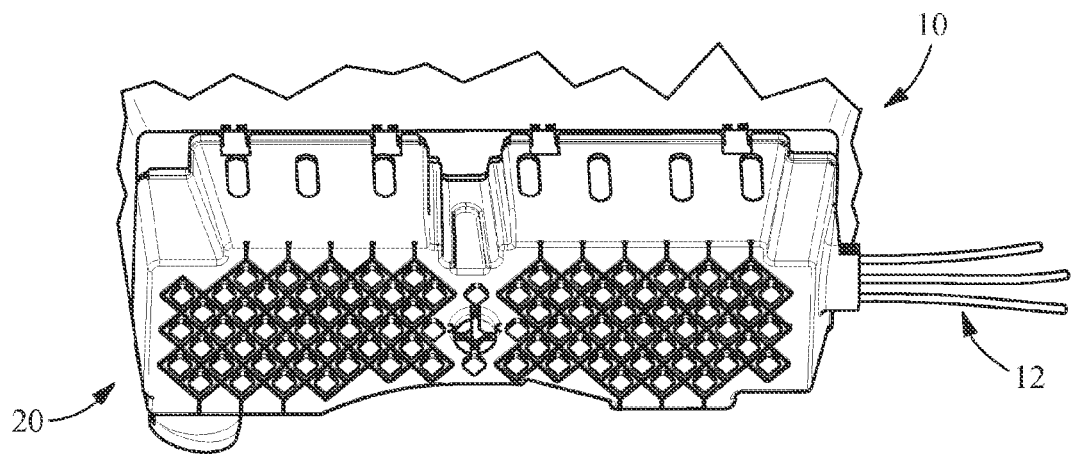
FIG. 1 is a perspective view of an illustrative wire dress cover positioned on a connector.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

As shown in FIG. 1, a wire dress cover 20 is positioned on an electrical connector 10. The wire dress cover 20 is configured to gather and dress wires 12 as the cover 20 is being positioned on the housing of the electrical connector 10. When properly positioned, the wire dress cover 20 provides an efficient alignment of the wires 12 extending from the electrical connector 10. The wire dress cover 20 is also configured to allow for heat to be dissipated from the wires 12 and the electrical terminations while providing protection against unwanted material, such as water, from affecting the wires and the electrical terminations.

In the illustrative embodiment shown, the wire dress cover 20 is unitarily molded from a plastic material and effectively defines an open shell. However, other embodiments, such as, but not limited to, the wire dress cover being made from a pair of shells mated together, may be used without departing from the scope of the invention.

Figure 2:
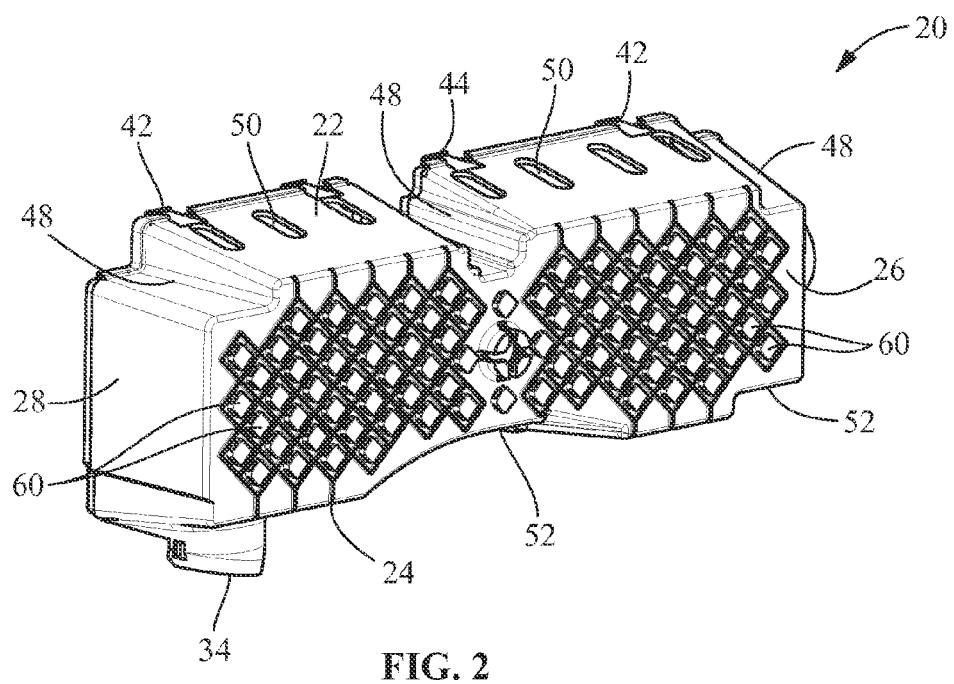
FIG. 2 is a perspective view of the wire dress cover of FIG. 1 removed from the connector.
Figure 3:
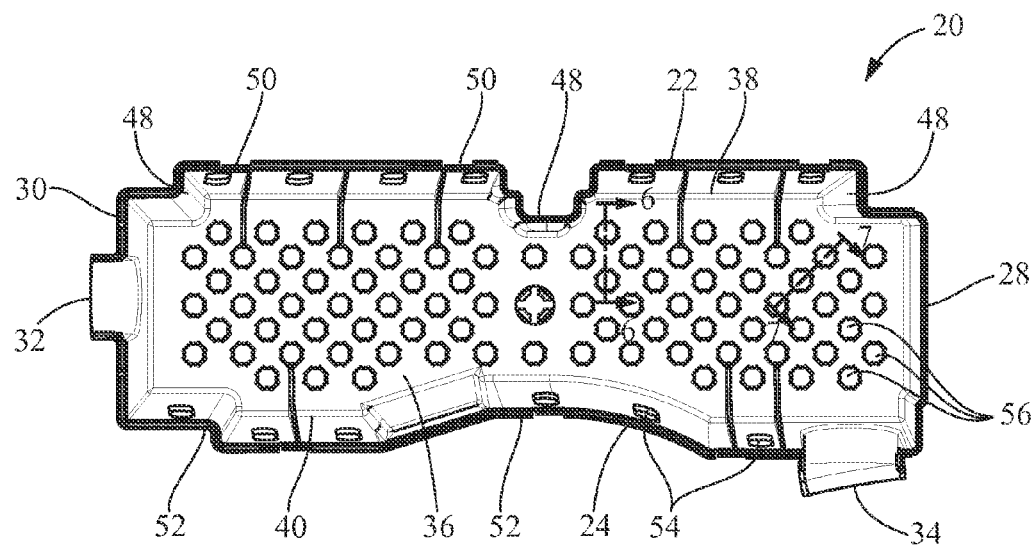
FIG. 3 is a bottom view of the wire dress cover of FIG. 2.
Figure 4:
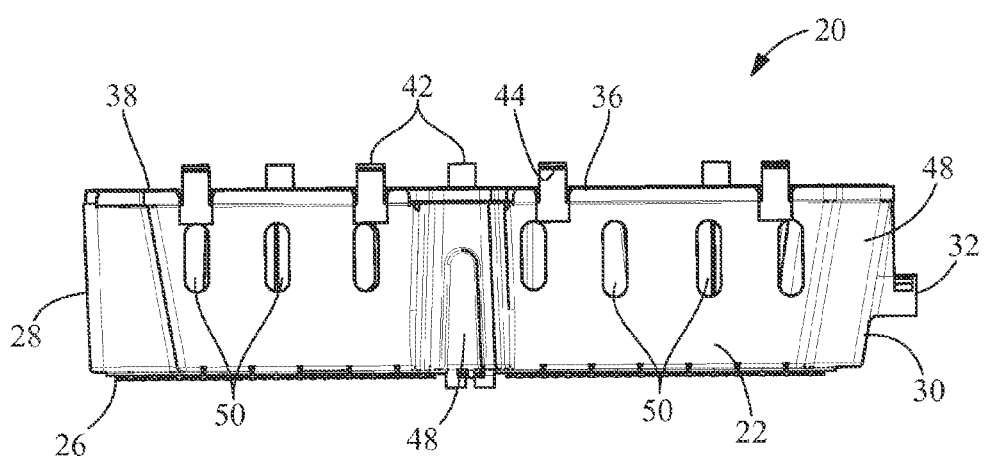
FIG. 4 is a side view of the wire dress cover of FIG. 2.

As best shown in FIGS. 2 through 4, the wire dress cover 20 includes opposed first and second side walls 22 and 24. A top or rear wall 26 extends between the first and second side walls 22 and 24. A first end wall 28 extends between the first and second side walls 22, 24 and further extends from the rear wall 26. A second end wall 30, which is essentially opposed to the first end wall 28, extends between the first and second side walls 22, 24 and further extends from the rear wall 26. The second end wall 30 has a wire-receiving opening 32 which defines a region for the substantially dressed or aligned wires 12 to extend from the wire dress cover 20 and the electrical connector 10. Alternatively, or in addition to the wire-receiving opening 32, a second wire-receiving opening 34 may be provided in the second side wall 24, the wire-receiving opening 34 also defining a region for the substantially dressed or aligned wires 12 to extend from the wire dress cover 20 and the electrical connector 10. The wire dress cover 20 further includes an opened face 36 defined by first and second front edges 38, 40 of the respective first and second side walls 22, 24.

While an exemplary embodiment of the wire dress cover 20 is shown, other configurations of the wire dress cover 20 may be used. In one such alternate embodiment, the rear wall extends orthogonally between the first and second side walls. The first and second side walls are of substantially trapezoidal configuration, allowing the wire dress cover to gather the wires.

Extending from the first and second edges 38, 40 are latching projections 42. The latching projections 42 are spaced periodically along the first and second edges 38, 40 and extend in a direction away from the rear wall 26. The latching projections 42 have shoulders 44 which cooperate with the openings (not shown) of the connector 10 to maintain the wire dress cover 20 on the connector 10. The wire dress cover 20 can be removed from the connector 10 by merely pinching areas of the first and second side walls 22, 24 toward one another. While an exemplary embodiment of the wire dress cover 20 shows a snap-fit connection between the wire dress cover 20 and the connector 10, other configurations of mounting the wire dress cover 20 to the connector 10 may be used. In one such alternate embodiment, the first and second side walls 22, 24 may have ribs formed generally adjacent to the corresponding front edges 38, 40 thereof. The ribs of the wire dress cover 20 may be slid into channels of the connector 10 to retain the wire dress cover 20 in position on the connector.

As best shown in FIGS. 2 and 3, the first side wall 22 extends from the rear wall 26 at an angle greater than ninety degrees, although other angles can be used without departing from the scope of the invention. Indentations 48 are provided in the first side wall 22. The indentations 48 are provided to stiffen the first side wall 22, thereby enhancing the overall strength of the wire dress cover 20. Openings 50 are provided periodically along the first side wall 22. The openings allow heat generated by the wires 12 and the electrical terminals to be dissipated. Similarly, the second side wall 24 extends from the rear wall 26 at an angle greater than ninety degrees, although other angles can be used without departing from the scope of the invention. Indentations 52 are provided in the second side wall 24. The indentations 52 are provided to stiffen the second side wall 24, thereby enhancing the overall strength of the wire dress cover 20. Openings 54 are provided periodically along the first side wall 22. The openings 50, 54 allow heat generated by the wires 12 and the electrical terminals to be dissipated to the outside of the cover 20. The shape of the side walls 22, 24 and the indentations 48, 52 can be varied depending upon the strength characteristics required for the wire dress cover 20 and the shape of the space into which the wire dress cover 20 is positioned.

As best shown in FIG. 3, heat dissipating openings 56 extend through the rear wall 26. In the embodiment shown, the heat dissipating openings 56 are provided in rows, with adjacent rows being offset from or interwoven with each to allow more heat dissipating openings 56 to be provided on the rear wall 26, however other patterns or configurations of the heat dissipating openings 56 can be used without departing from the scope of the invention. The heat dissipating openings 56 allow heat generated by the wires 12 and the electrical terminals to be dissipated to the outside of the cover 20.

Figure 5:
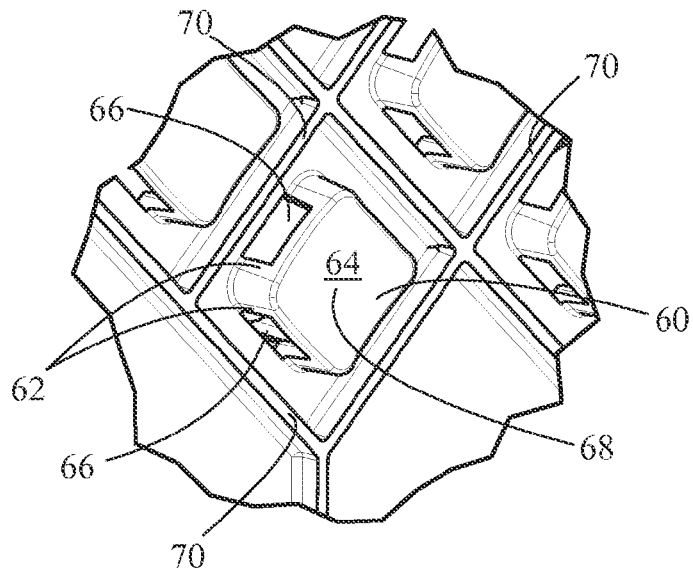
FIG. 5 is an enlarged perspective view of a portion of a surface of the wire dress cover of FIG. 2, showing a perspective view of a respective splash guard.
Figure 6:
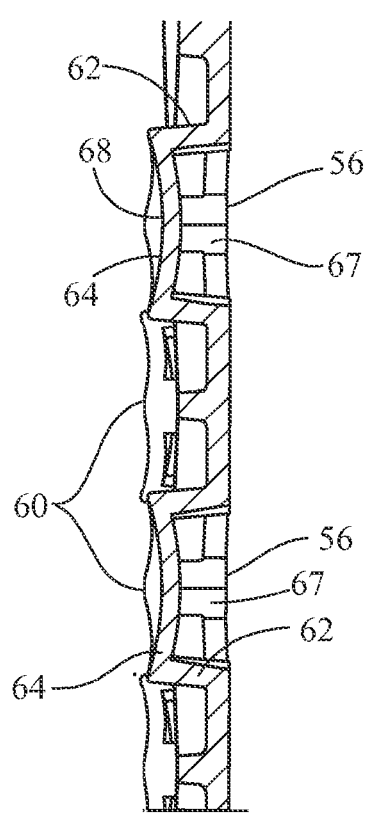
FIG. 6 is a cross-sectional view taken along lines 6-6 of FIG. 3.
Figure 7:
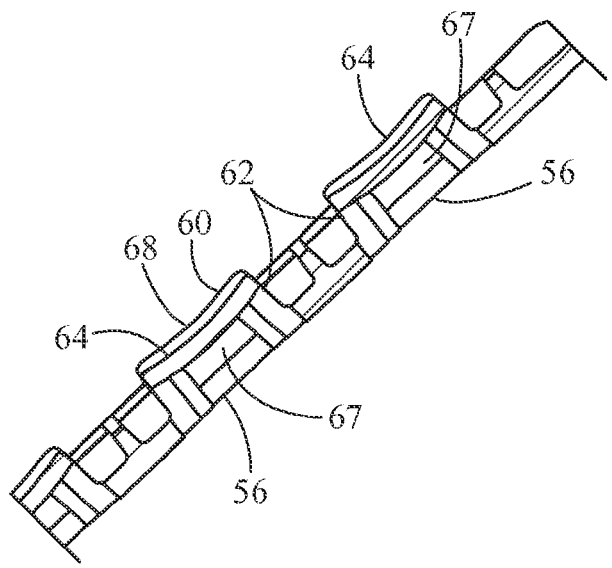
FIG. 7 is a cross-sectional view taken along lines 7-7 of FIG. 3.

As best shown in the illustrative embodiment of FIGS. 5 through 7, splash guards or guards 60 extend from the rear wall 26 in a direction generally away from the front edges 38, 40 of the first and second side walls 22, 24. The guards 60 have side walls 62 which extend from rear wall 26 to a top wall 64. The guards 60 are positioned proximate the heat dissipating openings 56.

Guard side walls 62 extend from the rear wall 26 at an angle which is greater than ninety degrees, although other angles can be used without departing from the scope of the invention. At least one side wall opening 66 is provided in each side wall 62. The side wall openings 66 extend from the outside of the guards 60 to the hollow interiors 67 of the guards 60. The hollow interiors 67 of the guards 60 extend to heat dissipating openings 56 of the rear wall 26. This provides a pathway from the interior of the wire dress cover 20, through the heat dissipating openings 56 through the interiors 67 of the guards 60 through the openings 66, to the outside of the wire dress cover 20, thereby allowing heat generated in the interior of the wire dress cover 20 to be dissipated to the outside of the wire dress cover 20. While the side wall openings 66 allow for heat to be dissipated therethrough, the size and orientation of the side wall openings 66 minimize or eliminate unwanted material, such as water, from entering the interior of the wire dress cover 20, thereby minimizing the impact of such unwanted materials on the wires 12 and the electrical terminations.

The top walls 64 of the guards 60 are configured to deter, prevent or minimize the amount of unwanted material that enters the interior of the wire dress cover 20 through the openings 66. As viewed in FIG. 7, the top walls 64 extend over all or a portion of the heat dissipating openings 56 in the rear wall 26. This causes any unwanted material to first contact the top walls 64 and be repelled away from the wire dress cover 20. Due to the orientation of the side wall openings 66 provided in the guards 60, the unwanted material is generally repelled prior to approaching the openings 66, thereby minimizing the amount of unwanted material which enters the openings 66. In the embodiment shown, the guards 60 and top walls 64 are provided in rows to repeat the pattern of the heat dissipating heat dissipating openings 56, with adjacent rows being offset from or interwoven with each to allow more heat dissipating openings 56 and guards 60 to be provided on the rear wall 26, however other patterns or configurations of the heat dissipating openings 56 and guards 60 can be used without departing from the scope of the invention.

In the illustrative embodiments shown, a top surface of the top wall 64 has a curved surface 68. The curved surface 68 facilitates the deflection of the unwanted material away from the openings 66. For example, if water droplets contact the curved surface 68, respective water droplets which contact the outer edges of the curved surface 68 will be repelled in a direction which is both away from the wire dress cover 20 and toward the center of the respective curved surface 68. In so doing, the water droplets are moved away from the openings 66, thereby minimizing the amount of water droplets that enters into the openings 66. In the illustrative embodiment, the curved surface has a concave configuration, although other configurations may be used without departing from the scope of the invention.

In the illustrative embodiment shown, the heat dissipating openings 56 and the top walls 64 are in the shape of squares or diamonds. The shape of the side wall openings 66 is rectangular. However, other shapes of heat dissipating openings 56, top walls 64, and side wall openings 66 may be used without departing from the scope of the invention.

Strengthening ribs or projections 70 are provided on the rear wall 26 of the wire dress cover 20. In the illustrative embodiment shown, the ribs 70 extend diagonally across the rear wall 26, however other patterns or configurations of the ribs 70 can be used without departing from the scope of the invention. The ribs 70 are provided between adjacent guards 60. The ribs 70 facilitate the splash guards 60 being recessed relative to the exterior surface of the rear wall 26. Recessing the guards 60 helps to prevent the guards 60 from engaging and interfering with other wires or components which are present in the environments in which the wire dress covers 20 are used, such as, but not limited to, engine compartments of an automobile.

In summary, a wire dress cover is provided for engagement with a connector. The wire dress cover is configured to gather and dress wires. When properly positioned, the wire dress cover will provide an efficient alignment of all wires extending from the rear end of the electrical connector housing. The wire dress cover provides heat dissipation while providing protection to the wires and the electrical terminations.

While the invention has been described with reference to a preferred embodiment, it will be understood by those skilled in the art that various changes may be made and equivalents may be substituted for elements thereof without departing from the spirit and scope of the invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof. One skilled in the art will appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A wire dress cover for an electrical connector, the wire dress cover comprising:
    a rear wall having heat dissipating openings extending therethrough;
    side walls and end walls extending from the rear wall;
    at least one wire receiving opening provided in the side walls or the end walls;
    guards positioned proximate the heat dissipating openings, the guards having guard side walls with side wall openings extending therethrough, top walls of the guards extending from the guard side walls, the top walls extending over at least a portion of the heat dissipating openings;

wherein the heat dissipating openings and the side wall openings allow for heat generated inside the wire dress cover to be dissipated to the outside of the wire dress cover, while the top walls of the guards deter material from entering the inside of the wire dress cover.

2. The wire dress cover as recited in claim 1, wherein the heat dissipating openings and the guards are provided in rows, with adjacent rows being offset from each other.

3. The wire dress cover as recited in claim 1, wherein indentations are provided on the side walls of the wire dress cover, the indentations stiffen the side walls.

4. The wire dress cover as recited in claim 1, wherein latching projections extend from the side wall of the wire dress cover, the latching projections cooperate with the electrical connector to maintain the wire dress cover on the electrical connector.

5. The wire dress cover as recited in claim 1, wherein each guard has four guard side walls, with each guard side wall having at least one of the side wall openings extending therethrough.

6. The wire dress cover as recited in claim 1, wherein the top walls of the guards have concave curved top surfaces to facilitate deflection of the material away from the side wall openings.

7. The wire dress cover as recited in claim 1, wherein strengthening ribs are provided on the rear wall.

8. The wire dress cover as recited in claim 7, wherein the strengthening ribs are provided adjacent the guards.

9. The wire dress cover as recited in claim 8, wherein the guards are recessed relative to an exterior surface of the rear wall.

10. A wire dress cover for an electrical connector, the wire dress cover comprising:
    a rear wall having heat dissipating openings extending therethrough;
    side walls and end walls extending from the rear wall;
    at least one wire receiving opening provided in the side walls or the end walls, the at least one wire receiving opening providing a region for wires to extend from the wire dress cover and the electrical connector;
    splash guards positioned proximate the heat dissipating openings, the splash guards having guard side walls with side wall openings extending therethrough, top walls of the splash guards extending from the guard side walls, the top walls extending over at least a portion of the heat dissipating openings, the top walls having curved top surfaces;
    wherein the heat dissipating openings and the side wall openings allow for heat generated inside the wire dress cover to be dissipated to the outside of the wire dress cover, while the top walls of the splash guards deflect material from entering the wire dress cover.

11. The wire dress cover as recited in claim 10, wherein each splash guard has four guard side walls, with each guard side wall having at least one of the side wall openings extending therethrough.

12. The wire dress cover as recited in claim 10, wherein the top walls of the splash guards have concave curved top surfaces to facilitate deflection of the material away from the side wall openings.

13. The wire dress cover as recited in claim 10, wherein the heat dissipating openings and the splash guards are provided in rows, with adjacent rows being offset from each other.

14. The wire dress cover as recited in claim 13, wherein strengthening ribs are provided on the rear wall.

15. The wire dress cover as recited in claim 14, wherein the strengthening ribs are provided adjacent the splash guards.

16. The wire dress cover as recited in claim 15, wherein the splash guards are recessed relative to an exterior surface of the rear wall.

17. A wire dress cover for an electrical connector, the wire dress cover comprising:
    a rear wall having heat dissipating openings extending therethrough;
    splash guards positioned proximate the heat dissipating openings, the splash guards having guard side walls with side wall openings extending therethrough, top walls of the splash guards extending from the guard side walls, the top walls extending over at least a portion of the heat dissipating openings, the top walls having concave curved top surfaces;
    wherein the heat dissipating openings and the side wall openings allow for heat generated inside the wire dress cover to be dissipated to the outside of the wire dress cover, while the top walls of the splash guards deflect material from entering the wire dress cover.

18. The wire dress cover as recited in claim 17, wherein the heat dissipating openings and the splash guards are provided in rows, with adjacent rows being offset from each other.

19. The wire dress cover as recited in claim 17, wherein strengthening ribs are provided on the rear wall.

20. The wire dress cover as recited in claim 17, wherein the splash guards are recessed relative to an exterior surface of the rear wall.

\* \* \* \* \*